United States Patent [19]
Swan et al.

[11] Patent Number: 5,977,836
[45] Date of Patent: Nov. 2, 1999

[54] METHOD AND APPARATUS FOR CONTROLLING AN OUTPUT FREQUENCY OF A PHASE LOCKED LOOP

[75] Inventors: Philip Lawrence Swan, Toronto; David Ian James Glen, North York, both of Canada

[73] Assignee: ATI International SRL, West Indies

[21] Appl. No.: 08/876,731

[22] Filed: Jun. 16, 1997

[51] Int. Cl.[6] ...................................................... H03L 7/18
[52] U.S. Cl. .............................. 331/1 A; 331/14; 331/16; 331/20; 345/213; 327/159; 327/160
[58] Field of Search ................................ 331/1 A, 20, 16, 331/14; 327/141, 147, 156, 159, 160; 345/213; 375/376

[56] References Cited

U.S. PATENT DOCUMENTS 5,700,357  12/1997  Bland et al. ............................ 331/1 A

*Primary Examiner*—Arnold Kinkead
*Attorney, Agent, or Firm*—Markison & Reckamp

[57] ABSTRACT

A method and apparatus for controlling an output frequency of a phase locked loop is accomplished by determining a plurality of divider ratios which are based on an input frequency, parameters, and a desired output frequency. Each of the divider ratios is representative of a ratio between the output frequency and input frequency of the phase locked loop. Having determined the plurality of divider ratios, another determination is subsequently made to determine whether the plurality of divider ratios enable the phase locked loop to produce the output frequency within a given frequency tolerance, i.e., within an allowable error. The determination is based on whether changing the divider ratio from the one of the plurality of ratios to an adjacent ratio causes the output frequency to change more than the allowable error. If so, the plurality of ratios needs to be recalculated based on a change in the input frequency and/or one of the parameters. When the output frequency can be established within the allowable error (i.e., a change from one of the divider ratios to another one produced calculated output frequencies that are within the allowable error), the phase locked loop utilizes one of the plurality of ratios to establish the output frequency. The PLL may further utilize other ratios of the plurality of ratios to finely adjust the output frequency thereby effecting a change on the display update rate.

21 Claims, 7 Drawing Sheets

METHOD AND APPARATUS FOR CONTROLLING AN OUTPUT FREQUENCY OF A PHASE LOCKED LOOP

TECHNICAL FIELD OF THE INVENTION

This invention relates generally to phase locked loops and more particularly to a method and apparatus for controlling the output frequency of a phase locked loop.

BACKGROUND OF THE INVENTION

It would be an understatement to say that computers have changed our society. Computers have made it possible to communicate data around the world in seconds, have access to more information than any one person could assimilate in ten life times, and countless other advantages. And, advances in computer technology are occurring every day. For example, video image processing is making dramatic advances in picture quality for all types of image sources such as multimedia imaging, video conferencing, video games, VCR (video cassette recorder), broadcast television, cable television, and DVD, to name just a few.

Displaying video images that were specifically designed to be displayed on a computer display can be done with the utmost of clarity. For example, still images and computer graphical interface images are displayed with great clarity on computer displays where the display refresh (or update) rate is set by standards bodies which may be 60 Hz, 75 Hz, 90 Hz, or 100 Hz. Because of the static nature of these images, the number being prepared for display, or the image update rate, exactly match the display update rate (the number of images the display will present in a second). Similarly, for television, the incoming images have an image update rate that exactly matches the display update rate of the television. In North America the television display update rate is approximately sixty Hertz and in Europe the television display update is approximately fifty Hertz.

A difficulty arises when displaying images with very precise update rates and were not specifically designed to be displayed on a computer display, such as images from television broadcasts, VCRs, DVDs, and cable television broadcasts. These video transmission mediums have their own image update rates. For example, North American television has an image update rate of 59.94 Hz, while European television has an image update rate of 50 Hz, and motion pictures have an image update rate of 24 Hz. Due to the differences between the image update rate of these video image mediums and the display update rate of the computer display, which are very small, update rate compensation is needed.

One update rate compensation technique is to drop or repeat an image when the timing between the image update rate and the display update rate is offset by an image (i.e., becomes a frame out of sync). When the image update rate is faster than the display update rate, images need to be dropped (i.e., not shown). While this keeps the image update rate in sync with the display update rate, the dropping of the images may be noticeable. For example, if the image that is dropped is one in a series of action images (an object is moving), there may be a noticeable jump in the movement of the object because of the dropped image. When the image update rate is slower than the display update rate, images need to be repeated to keep the update rates in sync. The repeated image may produce a noticeable jump for objects in motion, similar to the dropped image. Thus, this technique works well for still image projection, but for movies, sporting events, and other television broadcasts, it is not desirable because of the noticeable jumps.

Another update rate compensation technique is to reset the display update rate to equal the image update rate. While this overcomes the above mentioned difficulty, it creates a new one. When the display update rate is coarsely adjusted for some display devices during a mode change, the screen blanks for a few seconds to reset the display update rate. If the display update rate needs to be changed to initiate video, the blanking of the screen can be quite annoying to the user.

Therefore, a need exists for a method and apparatus that finely adjusts the display update rate by controlling the output frequency of a phase locked loop such that changes may be made to the display update rate without the adverse effects mentioned above.

DETAILED DESCRIPTION OF THE DRAWINGS

Generally, the present invention provides a method and apparatus for controlling an output frequency of a phase locked loop. This may be accomplished by determining a plurality of divider ratios which are based on an input frequency, parameters, and a desired output frequency. Each of the divider ratios is representative of a ratio between the output frequency and input frequency of the phase locked loop. Having determined the plurality of divider ratios, another determination is subsequently made to determine whether the plurality of divider ratios enable the phase locked loop to produce the output frequency within a given frequency tolerance, i.e., within an allowable error. The determination is based on whether changing the divider ratio from the one of the plurality of ratios to an adjacent ratio causes the output frequency to change more than the allowable error. If so, the plurality of ratios needs to be recalculated based on a change in the input frequency and/or one of the parameters. When the output frequency can be established within the allowable error (i.e., a change from one of the divider ratios to another one produced calculated output frequencies that are within the allowable error), the phase locked loop utilizes one of the plurality of ratios to establish the output frequency. The PLL may further utilize other ratios of the plurality of ratios to finely adjust the output frequency thereby effecting a change on the display update rate. With such a method and apparatus, the present invention allows a phase locked loop to adjust its output frequency in very small increments. Such fine adjustment of the output frequency may be utilized within a video graphic circuit to adjust the display update rate, or refresh rate, of an associated computer monitor without adverse visual affects.

Figure 1:
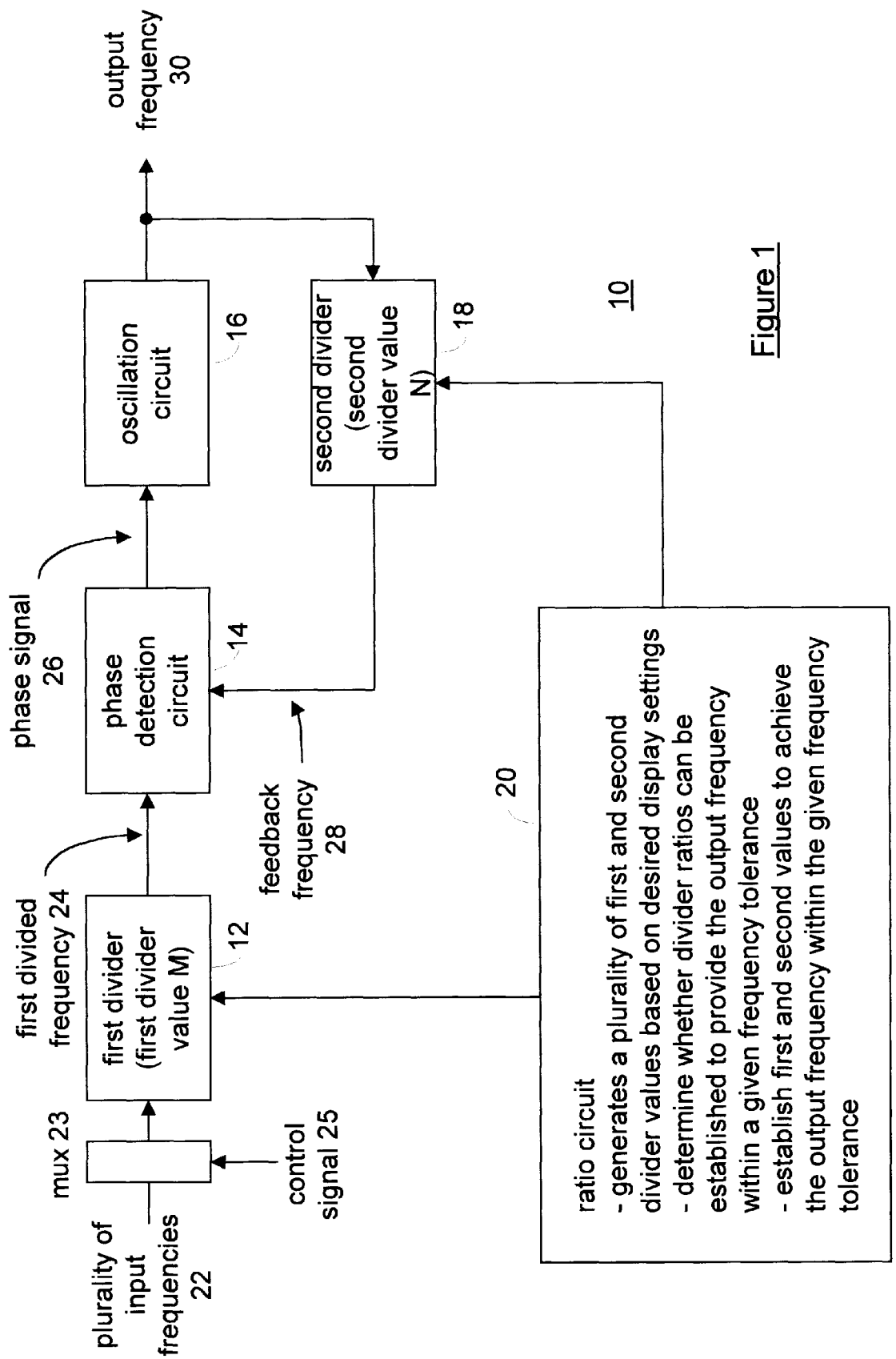
FIG. 1 illustrates a schematic block diagram of a phase locked loop which is in accordance with the present invention.

The present invention may be more fully described with reference to FIGS. 1 through 8. FIG. 1 illustrates a phase locked loop ("PLL") 10 which includes a first divider 12, a phase detection circuit 14, an oscillation circuit 16, a second divider 18, a multiplexor 23, and a ratio circuit 20. In operation, the first divider 12 receives one of the input frequencies 22, via multiplexor 23 which is controlled by control signal 25, and produces therefrom a first divided frequency 24. The first divider 12, which may be a counter, divides the input frequency by A integer value M. Thus, the first divided frequency 24 equals the input frequency 22 divided by M.

The phase detection circuit 14 receives, as inputs, the first divided frequency 24 and a feedback frequency 28. The phase detection circuit 14 generates a phase signal 26 based on the phase difference between the first divided frequency 24 and the feedback frequency 28. The resulting phase signal 26 will be a positive pulse when the first divided frequency 24 leads the feedback frequency 28. Conversely, the phase signal 26 will be a negative pulse when the feedback frequency 28 leads the first divided frequency 24. The phase signal 26 is provided to the oscillation circuit 16 which generates the output frequency 30, via a charge up/charge down circuit and a voltage control oscillator. The charge up/charge down circuit includes a capacitor which is charged or discharged by the phase signal 26. As such, when the positive pulse phase signal 26 is received, the voltage across the capacitor increases. Conversely, when the negative pulse phase signal 26 is received, the voltage across the capacitor decreases. The capacitor voltage is provided as a controlling input to the voltage control oscillator which produces the resulting output frequency 30. As one skilled in the art will readily appreciate, the positive pulse phase signal 26 increases the output frequency 30, while the negative pulse phase signal 26 decreases the rate of the output frequency 30.

The second divider 18 receives the output frequency 30 and generates therefrom the feedback signal 28. The second divider 18, which may be a counter, divides the output frequency 30 by a integer value, or divider value, of N. In this configuration, the output frequency equals N times the input frequency divided by M.

Figure 7:
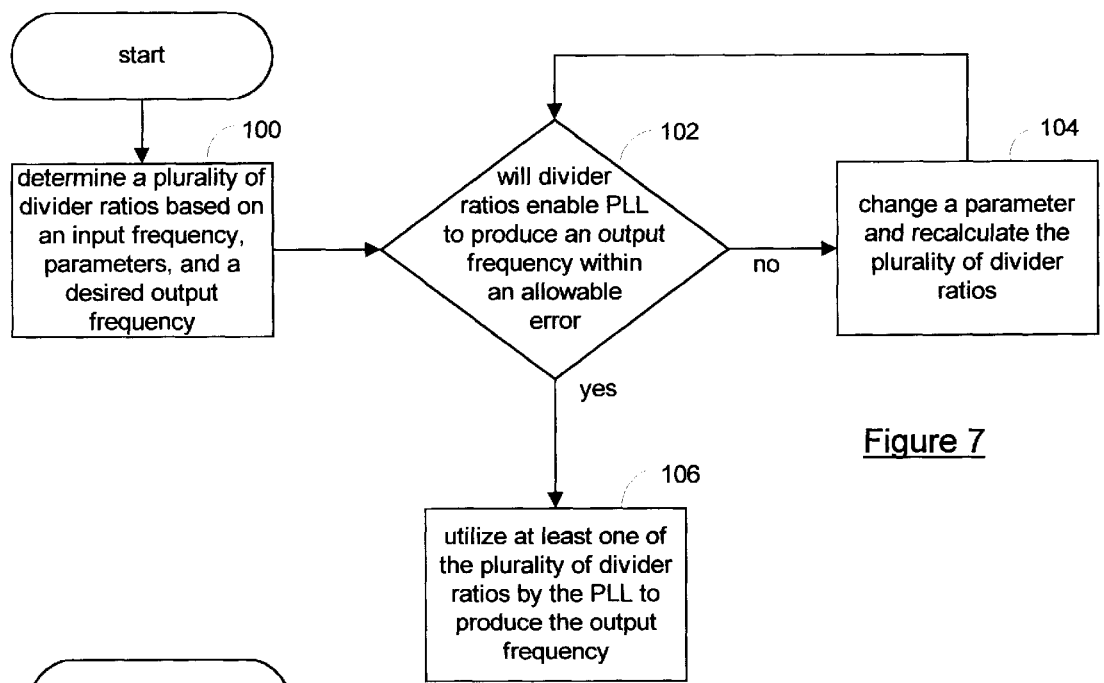
FIG. 7 illustrates a logic diagram which may be used to implement the phase locked loop in accordance with the present invention.
Figure 8:
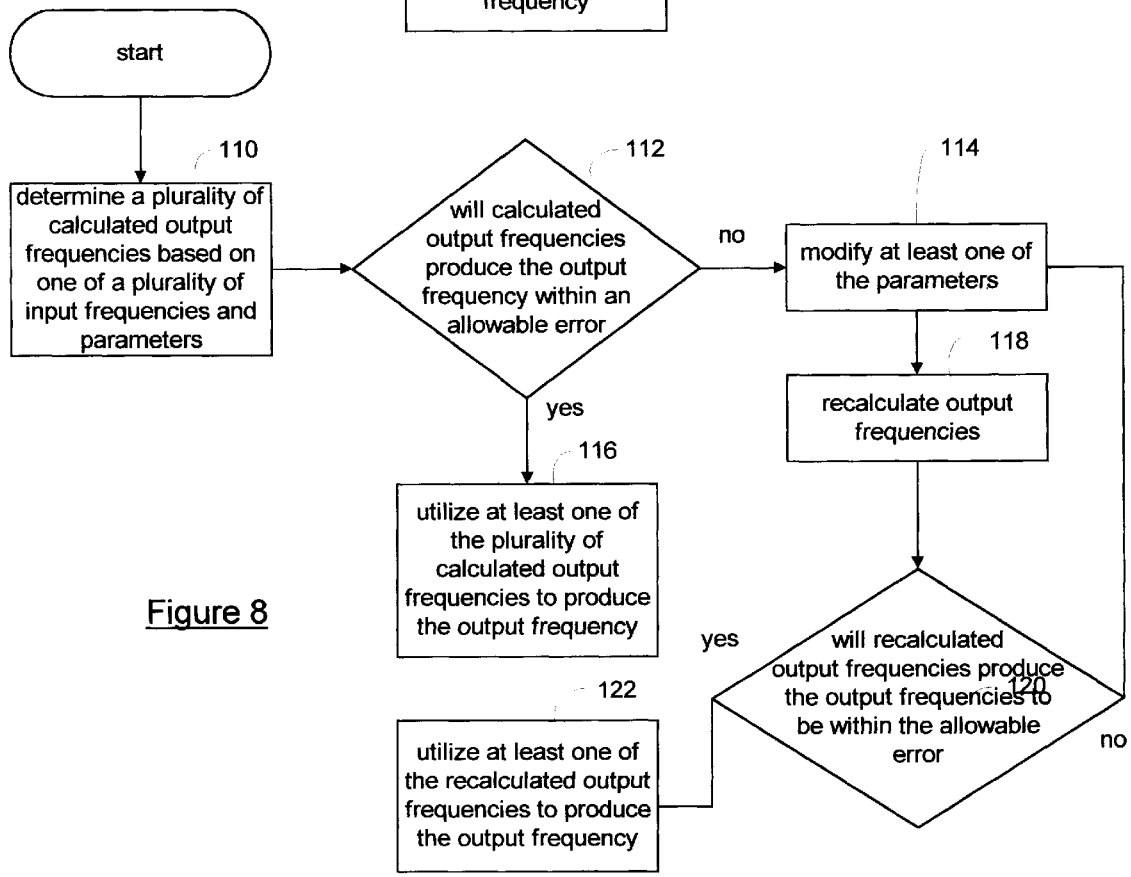
FIG. 8 illustrates a logic diagram which may be used to implement an alternate phase locked loop in accordance with the present invention.

The ratio circuit 20, which may be implemented by a microprocessor, micro-computer, digital signal processor, or any other processing device that manipulates digital data based on programming instructions, and memory provides the particular M and N values to the first and second dividers 12 and 18. The particular values of M and N are determined when the ratio circuit 20 evokes a set of associated programming instructions, which are illustrated in FIGS. 7 and 8. In additions to the processes of FIGS. 7 and 8, the programmring instructions may cause the ratio circuit 20 to generate a plurality of first and second divider values based on the selected input frequency and parameters, where the parameters include the control signal 25, a post divider value (52 of FIG. 2), and desired display settings which include the total number of lines in the horizontal direction of a computer screen, the total number of vertical lines of the computer screen, the current refresh rate of the computer, and the image update rate. The plurality of first and second divider values are then computed into a plurality of divider ratios from which the ratio circuit 20 determines whether each of the divider ratios, when used by the phase locked loop, will produce incremental changes of the output frequency, where successive incremental changes are within a given frequency tolerance, or allowable error of the output frequency. Such a given frequency tolerance may be set to establish a particular error rate such as plus or minus 50 PPM. As one skilled in the art will readily appreciate, the error rate, or given frequency tolerance, of the output frequency may vary depending on the particular design requirements of the phase locked loop which may range from 10 PPM to 500 PPM.

When the output frequency can be incremented within the given frequency tolerance using the plurality of divider ratios, the ratio circuit 20 establishes a first divider value and a second divider value from the plurality of first and second divider values. Such a selection would be based on matching, over time, the refresh rate of the computer screen with the image update rate of an image being displayed on the computer screen.

Figure 2:
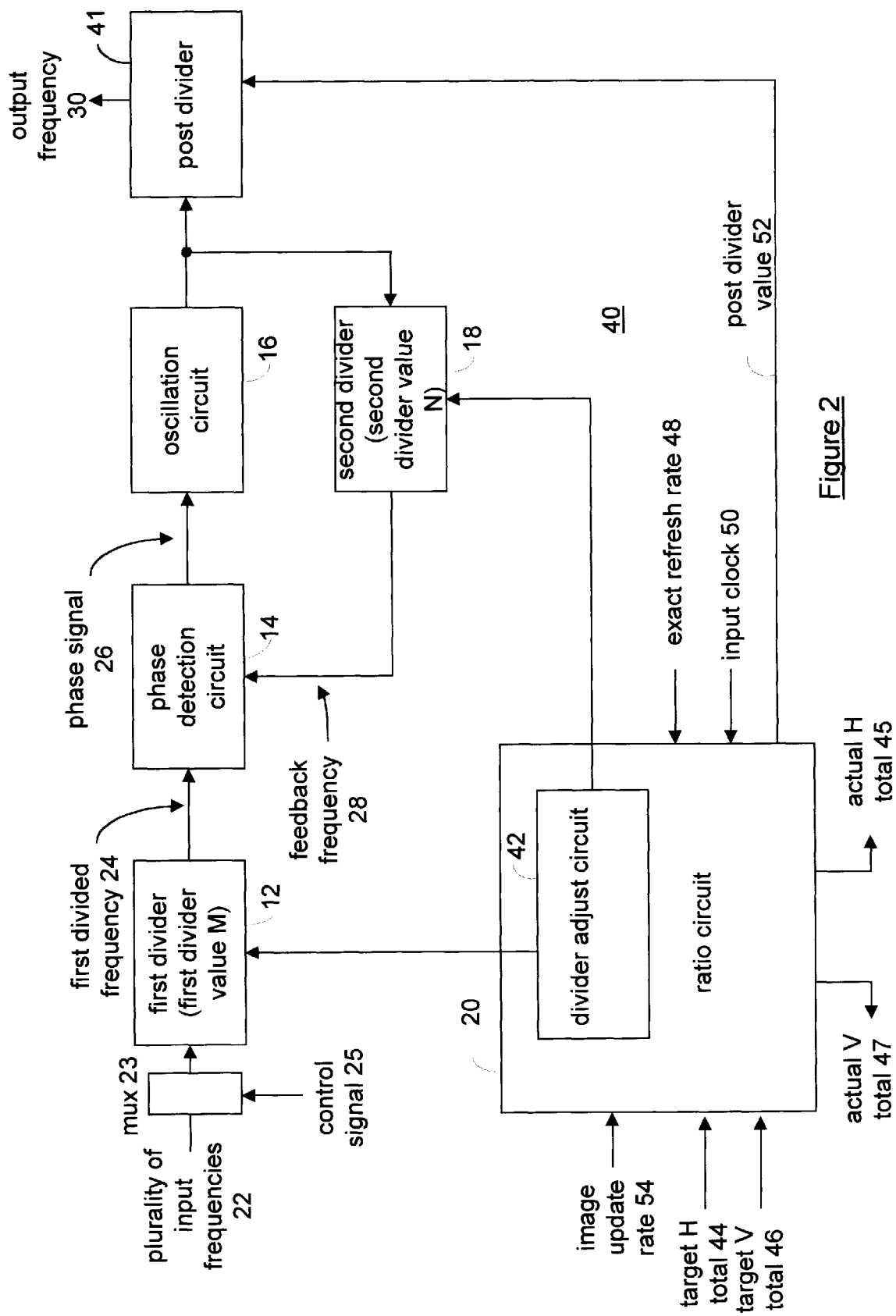
FIG. 2 illustrates a schematic block diagram of an alternate phase locked loop which is in accordance with the present invention.

FIG. 2 illustrates a schematic block diagram of a phase locked loop 40 which includes the multiplexor 23, the first divider 12, the phase detection circuit 14, the oscillation circuit 16, the second divider 18, the ratio circuit 20, and a post-divider 41. The operation of the phase locked loop 40 is similar to the operation of phase locked loop 10 in that the multiplexor 23, the first divider 12, the phase protection circuit 14, the oscillation circuit 16 and the second divider 18 function as previously described. As shown, the output of the oscillation circuit 16 is coupled to the post-divider 41. The post-divider 41 further divides the output frequency of the oscillation circuit 16 by a post-divider value 52, which is one of the parameters. By incorporating the post-divider 41, the input frequency 22 and the output frequency of oscillation circuit 16 may be greater values thereby allowing the first divider value M and the second divider value N to also be greater values. By increasing the values of first divider M and second divider N, the divider ratio of M to N may be more finely adjusted which provides better control of the output frequency 30, i.e., the more finely it can be adjusted by changing the M to N divider ratio.

The ratio circuit 20, which coordinates the adjusting of the first divider value M and the second divider value N, includes a divider adjustment circuit 42, which may be a microprocessor, a digital signal processor, or a micro-controller and associated memory. The divider adjustment circuit 42, based on an image update rate 54, horizontal total lines 44, vertical total lines 46, exact refresh rate 48, and input clock 50, generates the M to N divider ratio and provides the M and N values to the first divider 12 and the second divider 18, respectively. The creation and selection of the M to N divider ratio will be discussed in greater detail with reference to FIGS. 3 and 6 below.

Figure 3:
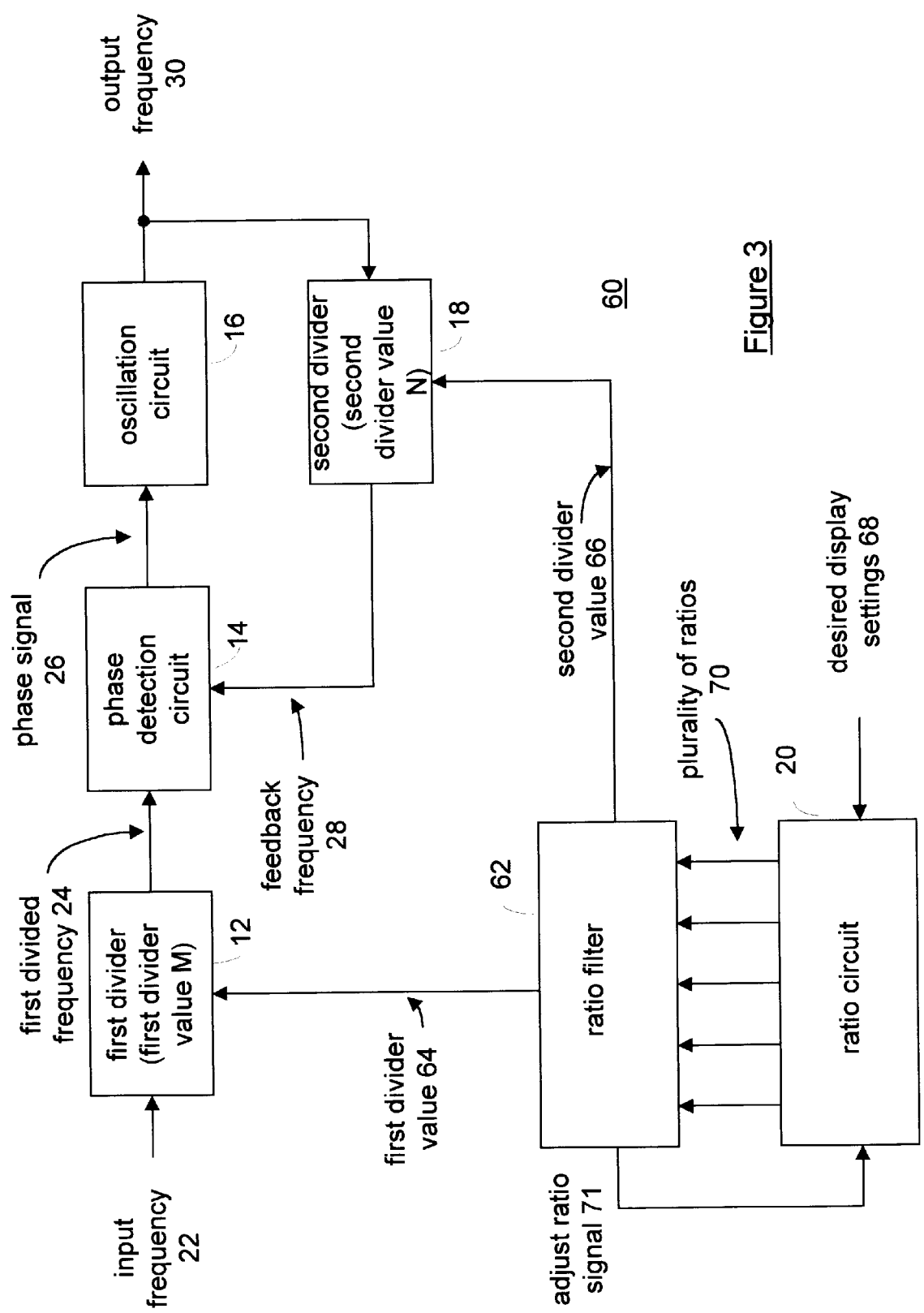
FIG. 3 illustrates a schematic block diagram of another alternative phase locked loop which is in accordance with the present invention.

FIG. 3 illustrates a schematic block diagram of a phase locked loop 60 which includes the first divider 12, the phase detection circuit 14, the oscillation circuit 16, and the second divider 18. The phase locked loop 60 further includes the ratio circuit 20 and a ratio filter 62. The function of the first divider 12, the phase detection circuit 14, the oscillation circuit 16, and the second divider 18, all function as previously discussed with reference to FIG. 1. The ratio circuit 20, as shown, generates a plurality of ratios 70 based on parameters which include desired display settings 68. For example, the parameters may include the post divider value 52, the control signal 25 and the desired displayed settings 68 which include the number of total horizontal lines, the total number of vertical lines, the display refresh rate, and the input clock rate. From these values, the ratio circuit 20 generates the plurality of ratios 70 of which the ratio filter selects at least one ratio to provide the M value to the first divider 12 and the N value to the second divider 18.

The generation of the plurality of ratios 70 further depends on the desired output frequency 30. If, for example, the input frequency, i.e., in the input clock, is 14 megahertz, and the output frequency is to be 100 megahertz, the first divider value M could be 70 while the second divider value N could be 500. In this example, the first divided frequency 24 would be 200 kilohertz as would the feedback frequency 28. As such, the plurality of ratios 70 generated by the ratio circuit 20 would be centered about a ratio of 70 to 500 (M to N). Other ratios of the plurality of ratios 70 would be minor deviations from the 70 to 500 M to N ratio. For example, the plurality of ratios may include 68 to 486; 69 to 494; 71 to 507; 72 to 514; and 73 to 521, etc. By providing the M to N ratio as a plurality of ratios, the output frequency may be slightly adjusted by selecting a different one of the M to N ratios, with the change in the output frequency remaining within the allowable error. For example, by utilizing the M to N ratio of 71 to 507, the output frequency equals 14 megahertz times 507 divided by 71 which equals 99.972 megahertz. Thus the error, or difference, for this particular M to N ratio from the 70 to 500 M to N ratio, the error rate is 0.028%.

By adjusting the M to N ratio, or selecting a different one of the plurality of ratios 70, the output frequency 30 may be changed by a very small percentage (Eg. less than 50 PPM) to adjust the display refresh rate of a computer. If, however, the desired M to N ratio does not exactly match one of the plurality of ratios, but the increments between the output frequency changes is within the given frequency tolerance, the ratio filter will select multiple M to N ratios and toggle between them such that, over time, they equal the desired M to N ratio. Such toggling may also be required at start up or after a disturbance, because a single calculated output frequency may not be within the allowable range, but, by flipping between calculated output frequencies will provide the output frequency to be, over time, within the allowable error rate.

If, however, the plurality of divider ratios do not provide the needed M to N ratios to maintain the error rate within acceptable values, i.e., an incremental change in the output frequency by changing divider ratios exceeds the allowable error rate, the ratio filter 62 generates an adjust ratio signal 71. The adjust ratio signal 71 causes the ratio circuit 20 to adjust one or more of the parameters, which include the desired display settings 68, and then recalculates the plurality of M to N ratios 70, which in turn is used to calculate a plurality of calculated output frequencies. For example, if the desired displayed settings 68 include a horizontal line total of 640 and a vertical line total of 480, the adjust ratio signal 71 may cause the ratio circuit to adjust the horizontal line total to 635 and/or the vertical line total to 475. Having made these adjustments, the ratio circuit generates a new plurality of ratios 70.

As a simplified example, assume that the desired refresh rate is 50.00 hertz, the horizontal line total is 250 and the vertical line total is 200. Thus, the video graphics circuit needs to generate 250,000 pixels per second (250 * 200 * 50). Further assume that the input frequency of the PLL is 250 kilohertz, thus, the desired output frequency is 2.5 megahertz. To achieve this 10 to 1 output to input frequency ratio, the first divider value M could be set to a value of 10 and the second divider value could be set to a value 100. Given these parameters, the phase locked loop will utilize an M to N ratio of 10 to 100. As long as the refresh rate remains at 50.00 Hz, the selected divider values will be unchanged.

Now assume that the display refresh rate needs to be 49.5 hertz to substantially match an image update rate of video being displayed, which provides a given frequency tolerance of 1.0%. Given this change, the video graphics circuit employing the phase locked loop 10 of FIG. 1 needs to generate an output frequency of 2.475 megahertz (49.5 * 250 * 200). As such, the needed M to N ratio is 0.101010 to obtain the desired output frequency from the 250 kilohertz input frequency. Further assume the plurality of ratios includes 10 ratio values as shown in the table below.

| M:N ratio | M:N decimal | Input freq. | Output freq. | error |
|---|---|---|---|---|
| 8:79 | 0.101266 | 250 kHz | 2.4687 MHz | 0.14% |
| 9:89 | 0.191124 | 250 kHz | 2.4722 MHz | 0.21% |
| 11:109 | 0.10097 | 250 kHz | 2.4773 MHz | 0.08% |
| 12:119 | 0.100840 | 250 kHz | 2.4792 MHz | 0.06% |
| 13:129 | 0.100775 | 250 kHz | 2.4808 MHz | 0.77% |
| 10:100 | 0.100000 | 250 kHz | 2.5000 MHz | 0.00% |
| 13:131 | 0.099237 | 250 kHz | 2.5192 MHz | 0.76% |
| 12:121 | 0.099174 | 250 kHz | 2.5208 MHz | 0.06% |
| 11:111 | 0.099099 | 250 kHz | 2.5227 MHz | 0.08% |
| 9:91 | 0.098991 | 250 kHz | 2.5278 MHz | 0.20% |
| 8:81 | 0.098765 | 250 kHz | 2.5313 MHz | 0.14% |

From the table, it can be seen that a 1.0 percent given frequency tolerance can be obtained with the M to N ratios, since none of the incremental changes exceeds the given frequency tolerance or allowable error. To achieve the 2.475 MHz output frequency, the M:N ratios of 9:89 and 11:109 would be used in an alternative manner producing, over time, the 2.475 MHz output frequency.

Continuing with this simplified example, now assume that the refresh rate needs to be 49.75 Hz to match the image update date rate. Given this new parameter, the output frequency of the PLL would need to be 2.4875 MHz (49.75 * 200 * 250) and the new given frequency tolerance would be 0.5%. As can be seen from the preceding table, the incremental frequency change from the M:N ratio of 10:100 exceeds the 0.5% given frequency tolerance, thus, the plurality of divider ratios is not acceptable for the current conditions. As such, at least one of the particular display setting parameters would need to be changed such that the desired output frequency would change correspondingly. By changing the "H" total of lines in the display to 249 and recalculating the bits per second required by the video graphics processor to adjust the refresh rate to 49.75 Hz, the output frequency needs to be 2.47755 MHz, which changes the given frequency tolerance to 0.906%. With this minor change, the preceding table utilizing an H total of 249 as opposed to 250 would provide the desired variations to the M to N ratio and maintaining the output frequency within the given frequency tolerance.

Figure 4:
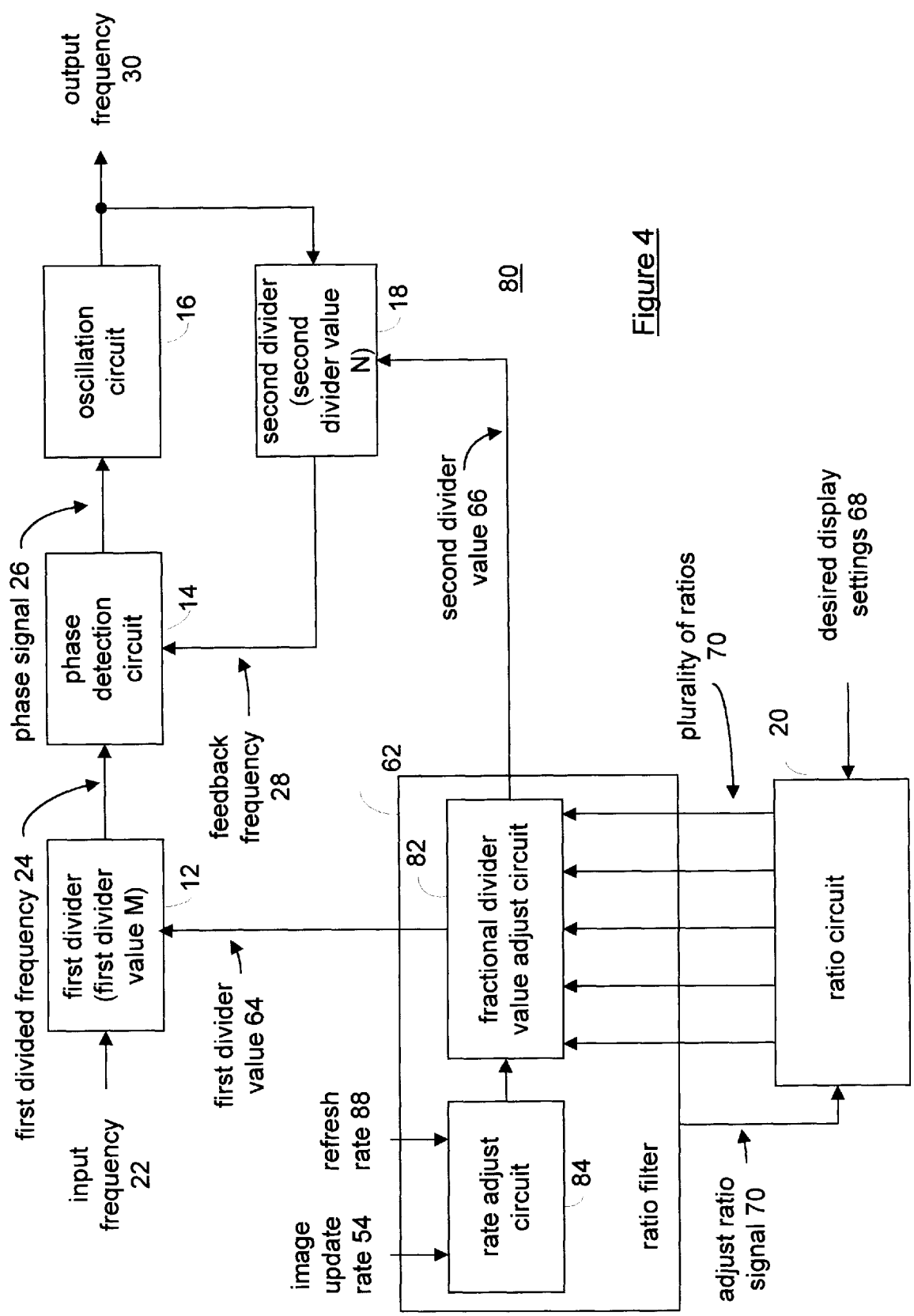
FIG. 4 illustrates a schematic block diagram of yet another alternate phase locked loop which is in accordance with the present invention.

FIG. 4 illustrates a schematic block diagram of a phase locked loop 80 which includes the first divider 12, the phase detection circuit 14, the oscillation circuit 16, the second divider 18, the ratio filter 62, and the ratio circuit 20. As shown, the ratio filter 62 includes a fractional divider value adjust circuit 82 and a rate adjust circuit 84. The rate adjust circuit 84 is operably coupled to receive an image update rate 54 and a refresh rate 88. As previously discussed, the image update rate 54 is the rate at which images are presented for display on a per second basis. The refresh rate is the per second rate of which the frame buffer of a video graphics. circuit is presented on a computer screen. The rate adjust circuit 84, based on these values, causes the fractional divider value adjust circuit 82 to select one of the plurality of ratio 70. Having selected one of the plurality of ratios, the fractional divider value adjust circuit 82 provides the first divider value and second divider value 66 to the appropriate dividers 12 and 18. For a more complete discussion of the rate adjust circuit refer to co-pending patent application, assigned to the same assignee as the present invention, and entitled METHOD AND APPARATUS FOR PHASE SHIFTING A CONTROLLED OSCILLATION AND APPLICATIONS THEREOF and to co-pending patent application, having a Ser. No. of 08/819,922, having the same assignee as the present patent application, and is entitled METHOD AND APPARATUS FOR DETECTING IMAGE UPDATE RATE DIFFERENCES.

Figure 5:
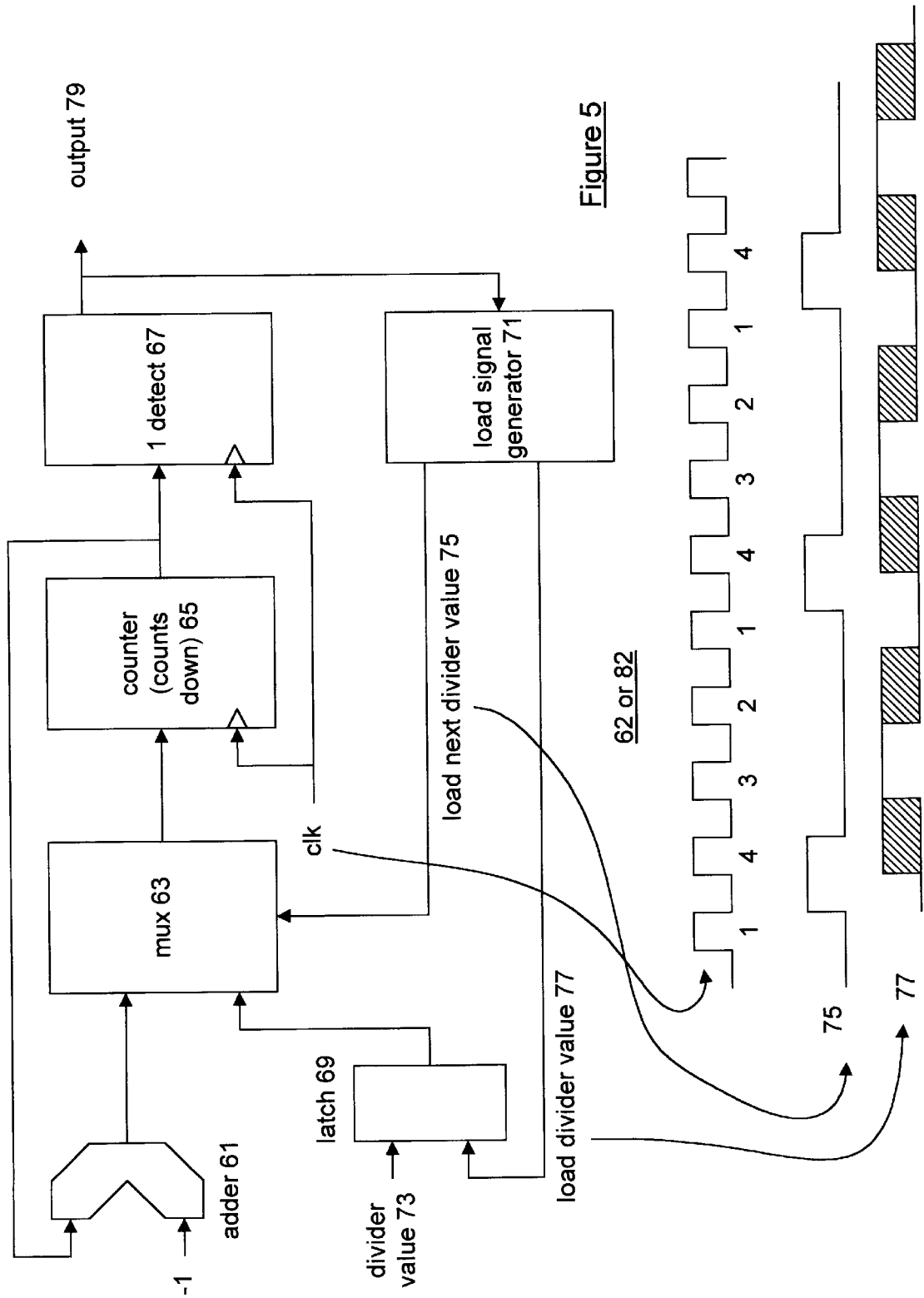
FIG. 5 illustrates a schematic block diagram of a divider value selection circuit of the ratio filter of FIGS. 3 and 4.

FIG. 5 illustrates a schematic block diagram of a divider value control circuit which is included in the ratio filter 62 or the fractional divider circuit 82. The circuit ensures that when the M and N divider values are adjusted, they are adjusted contemporaneously, such that the incremental change to the PLL is small. If the changing of M and N were not done contemporaneously, the PLL may become unstable, causes an error.

The circuit of FIG. 5 includes an adder 61, a multiplexor 63, a counter 65, a "1" detect circuit 67, a latch 69, and a load signal generator 71. In operation, the divider value 73 (M or N) is latched in to latch 69 when the load divider value 77 is in a logic "1" state. The latched divider value is then provided to the multiplexor 63, which subsequently provides it to the counter 65. The counter 65 counts down from the divider value until one is reached. At this point, the "1" detect circuit 67 outputs a pulse 79 for the duration, or a portion, of the clock cycle. The output 79 is provided as an input to the load signal generator 71, which produces the load next divider signal 75 and the load divider value 77. The adder 61 is used to change the divider value 73 by a given offset, the given offset shown is one.

The timing of the circuit is shown in the accompanying timing diagram. The output of the counter is shown in the first line and is counting down from 4, which is the divider value 73. At the leading edge of signal 75, the next divider value is loaded in to the latch 69. Note that the leading edge of signal 75 occurs after divider value has been counted down to one and a new counting cycle needs to begin. To ensure that the divider value is not being latched at the same time it is being retrieved, signal 77 is employed. As shown, signal 77 is in a logic one state after the leading edge of signal 75, thus enabling the latch to store any the divider value73, which will be used for the next count down.

Figure 6:
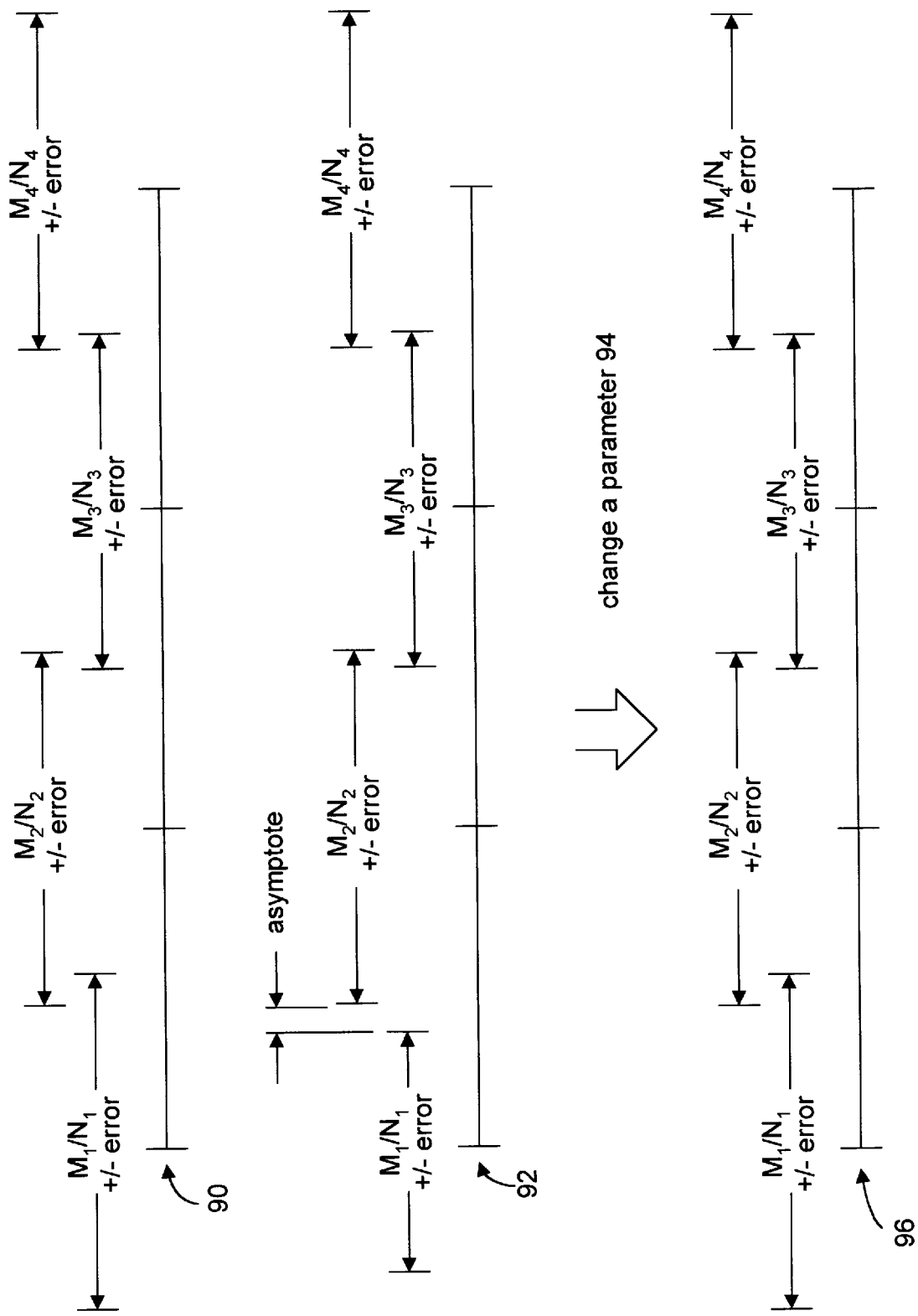
FIG. 6 illustrates a graphical representation of the first divider to second divider ratio in accordance with the present invention.

FIG. 6 illustrates a graphical representation of the plurality of M to N ratios that would produce calculated output frequencies within the given frequency tolerance, or allowable error. As shown in graphical illustration 90, the M to N ratios are shown to have overlapping areas given the error rate. Thus, the difference between the successive M to N ratios have an overlapping area. As discussed with reference to FIG. 3 and the accompanying table, an overlapping portion occurs when the desired frequency tolerance of the calculated output frequency is greater than the deviation produced by successive M to N ratios in the plurality of ratios. Thus, as long as the given frequency tolerance is greater than the maximum difference between successive output frequencies produced by the plurality of divider ratios, there will be an overlap between successive divider ratios. The overlap assures that the output frequency can be adjusted to a desired setting without exceeding the given frequency tolerance, thereby allowing the refresh rate to be adjusted without adverse visual affects on the display.

The next graphical representation 92 illustrates most of the plurality of M to N ratios overlapping. However, M to N ratio 1 and M to N ratio 2 have an asymptote between them. The asymptote occurs when a significant jump results in the M to N ratios. This can be illustrated from the table discussed above with reference to FIG. 3 wherein there is a sizable jump from the M to N ratio of 10 to 100 to any of the other M to N ratios in the table. Such a jump would be illustrated by the asymptote 92 which, for a 0.5% given frequency tolerance could not be achieved from the M to N ratios listed from the preceding table.

When an asymptote occurs, one of the parameters is changed, for example, the H total and/or V total are changed by adjusting the horizontal and/or vertical retrace rate and recalculating the ratios, as discussed above. This is represented by reference numeral 94. Having changed the H total and/or V total and recalculating the ratios, the M to N graphical representation 96 is as shown. As shown, the M to N ratios have overlapping portions therefore the output frequencies generated will be within a given frequency tolerance. Again referencing back to the table presented with the discussion of FIG. 3, by changing the H total by less than one percent (1%), the M to N ratios produce a plurality of output frequencies that are within the given frequency tolerance.

FIG. 7 illustrates a logic diagram that may be used by a video graphics processor to implement a phase locked loop in accordance with the present invention. The process begins at step 100 where a plurality of divider ratios are determined based on an input frequency, parameters, and a desired output frequency. The parameters include desired displayed settings which may include the total number of horizontal lines on a computer screen and in the horizontal retrace, the total number of vertical lines on the computer screens and in the vertical retrace, the refresh rate, and the accuracy of a reference clock, i.e., the input frequency of the PLL. The process then proceeds to step 102 where a determination is made as to whether the divider ratios will enable the phase locked loop to produce an output frequency within an allowable error. This has been discussed with reference to FIG. 3.

If, the divider ratios will not enable the phase locked loop to produce an output frequency within the allowable error, the process proceeds to step 104 where at least one parameter is changed and the plurality of divider ratios are recalculated. Having recalculated the plurality of ratios, the process reverts back to step 102 where it is determined whether the new dividers ratios will produce the output frequency within the allowable error. As previously mentioned, any one or all of the desired display settings may be adjusted for this purpose. If, however, the divider ratios enable the phase locked loop to produce an output frequency within the allowable error, the process proceeds to step 106 where at least one of the divider ratios is utilized by the phase locked loop to produce the output frequency.

FIG. 8 illustrates a logic diagram that may be used by a video graphics processor to implement the phase locked loop in accordance with the present invention. The process begins with step 110 where a plurality of calculated output frequencies are determined based on one of a plurality of input frequencies and parameters. The process then proceeds to step 112 where a determination is made as to whether the calculated output frequencies will enable a phase locked loop to produce an output frequency within an allowable error. If not, the process proceeds to step 114 where at least one of the parameters is modified. Having modified one of the parameters, the process proceeds to step 118 where the calculated output frequencies are recalculated. At this point, the process proceeds to step 120 where a determination is made as to whether the recalculated output frequencies will enable the phase locked loop to produce an output frequency within the allowable error. If not, the process reverts back to step 114. If so, the process proceeds to step 122. At step 122, at least of one of the recalculated outuput frequencies will be utilized by the phase locked loop to produce the output frequency. If, however, at step 112 the calculated output frequencies will enable the phase locked loop to produce an output frequency within the allowable error, the process proceeds to step 116 where at least one of calculated output frequencies is utilized by the phase locked loop to produce the output frequency.

The preceding discussion has provided a method and apparatus for making fine adjustments to the output frequency of a phase locked loop. Such a phase locked loop may be incorporated into a video graphics processor such that the display update rate, or refresh rate, may be finely tuned to match an image update rate. Such adjustments may be done in a manner that does not cause adverse visual effects to the computer display.

What is claimed is:

1. A method for controlling an output frequency of a phase locked loop, the method comprising the steps of:
   a) determining a plurality of divider ratios based on an input frequency, parameters, and a desired output frequency, wherein the parameters include display settings;
   b) determining whether the plurality of divider ratios will enable the phase locked loop to produce the output frequency within an allowable error;
   c) when the plurality of divider ratios will enable the phase locked loop to produce the output frequency within the allowable error, utilizing at least one of the plurality of divider ratios to produce the output frequency; and
   determing that the plurality of divider ratios will not enable the phase locked loop to produce the output frequency within the allowable error when the plurality of divider ratios includes at least one asymptote divider ratio.

2. The method of claim 1 further comprises, within step (a), determining the plurality of divider ratios based on the display settings being at least one of: horizontal line totals, vertical line totals, image update rate, and refresh rate.

3. The method of claim 2 further comprises, within step (b), establishing the allowable error based on the desired display settings.

4. The method of claim 1 further comprises determining the plurality of divider ratios based on a post divider being one of the parameters.

5. The method of claim 1 further comprises selecting another input frequency from a plurality of input frequencies when the plurality of divider ratios will not enable the phase locked loop to produce the output frequency within the allowable error.

6. The method of claim 1 further comprises, within step (c), alternating between utilizing two of the plurality of divider ratios to establish a desired divider ratio such that the output frequency is within the allowable error.

7. The method of claim 6 further comprises adjusting the at least one of the plurality of divider ratios based on a difference between a refresh rate of a display and an image update rate.

8. A method for controlling an output frequency of a phase locked loop, the method comprising the steps of:

a) determining a plurality of calculated output frequencies based on one of a plurality of input frequencies and parameters, wherein the parameters include a control signal for selecting the one of the plurality of input frequencies, at least one divider ratio, and display settings and wherein each of the plurality of input frequencies has an input frequency accuracy;

b) determining whether the plurality of calculated output frequencies will provide the output frequency to be within an allowable error rate of a desired output frequency;

c) when the plurality of calculated output frequencies will not provide the output frequency to be within the allowable error rate, modifying at least one of the parameters to produce modified parameters;

d) repeating steps (a) through (c) based on the modified parameters; and e) when the plurality of calculated output frequencies will provide the output frequency to be within the allowable error rate, utilizing at least one of the plurality of calculated output frequencies as the output frequency.

9. The method of claim 8 further comprises, within step (a), determining the plurality of calculated output frequencies based on the display settings being at least one of: horizontal line totals, vertical line totals, image update rate, and refresh rate.

10. The method of claim 8 further comprises adjusting the at least one divider ratio based on a difference between a refresh rate of a display and an image update rate.

11. The method of claim 8 further, within step (c), selecting another one of the plurality of input frequencies as the modified parameters.

12. A phase locked loop circuit comprising:

a first divider operably coupled to receive an input frequency and to produce a first divided frequency based on a first divider value;

a phase detection circuit that produces a phase signal based on phase difference between the first divided frequency and a feedback frequency;

an oscillation circuit operably coupled to receive the phase signal and to produce an output frequency;

a second divider operably coupled to receive the output frequency and to produce the feedback based on a second divider value;

ratio circuit operably coupled to the first divider and the second divider, wherein the ratio circuit (a) determines a plurality of divider ratios based on one of a plurality of input frequencies, parameters, and a desired output frequency, wherein the parameters include display settings and a control signal for selecting the one of the plurality of input frequencies; (b) determines whether the plurality of divider ratios will enable the phase locked loop to produce the output frequency within an allowable error; and (c) utilizes at least one of the plurality of divider ratios to produce the output frequency when the plurality of divider ratios will enable the phase locked loop to produce the output frequency within the allowable error.

13. The phase locked loop circuit of claim 12 further comprises, within the ratio circuit, a divider adjust circuit operably coupled to the ratio circuit, the first divider, and the second divider, wherein the divider adjust circuit selects one of the plurality of divider ratios based on a difference between a refresh rate of a display and an image update rate.

14. The phase locked loop circuit of claim 12 comprises the ratio circuit being operably coupled to receive a horizontal line total, a vertical line total, image update rate, and refresh rate as the display settings.

15. The phase locked loop circuit of claim 14 further comprises the ratio circuit adjusting at least one of the horizontal line total and the vertical line total when the plurality of divider ratios will not enable the phase locked loop to produce the output frequency within the allowable error.

16. The phase locked loop circuit of claim 12 further comprises the ratio circuit generating a post divider value based on at least one of the plurality of divider ratios.

17. A phase locked loop circuit comprising:
   a first divider operably coupled to receive an input frequency and to produce a first divided frequency based on a first divider value;
   a phase detection circuit that produces a phase signal based on phase difference between the first divided frequency and a feedback frequency;
   an oscillation circuit operably coupled to receive the phase signal and to produce an output frequency;
   a second divider operably coupled to receive the output frequency and to produce the feedback based on a second divider value;
   ratio circuit that generates a plurality of divider ratios based on at least one input frequency; and
   ratio filter operably coupled to the ratio circuit, wherein the ratio filter (a) determines a plurality of divider ratios based on one of a plurality of input frequencies, parameters, and a desired output frequency, wherein the parameters include display settings and a control signal for selecting the one of the plurality of input frequencies; (b) determines whether the plurality of divider ratios will enable the phase locked loop to produce the output frequency within an allowable error; and (c) utilizes at least one of the plurality of divider ratios to produce the output frequency when the plurality of divider ratios will enable the phase locked loop to produce the output frequency within the allowable error.

18. The phase locked loop circuit of claim 17 further comprises, within the ratio circuit, a rate adjust circuit and a fractional divider value adjust circuit, wherein the rate adjust signal produces a frequency adjust signal when a refresh rate of a display does not substantially match an image update rate, and wherein the fractional divider value adjust circuit adjusts the first and second divider values based on the adjust signal.

19. A method for controlling an output frequency of a phase locked loop, the method comprising the steps of:
   a) determining sets of a plurality of calculated output frequencies, wherein each plurality of calculated output frequencies is based on one of a plurality of input frequencies and parameters, wherein the parameters include a control signal for selecting the one of the plurality of input frequencies, at least one divider ratio, and display settings and wherein each of the plurality of input frequencies has an input frequency accuracy;
   b) determining whether each plurality of calculated output frequencies will provide the output frequency to be within an allowable error rate of a desired output frequency to produce at least one acceptable plurality of calculated output frequencies;
   c) selecting one set of the plurality of calculated output frequencies from the at least one acceptable plurality of calculated output frequencies based on at least one of: desired parameter settings and the plurality of input frequencies; and
   d) utilizing at least one of the plurality of calculated output frequencies of the one set as the output frequency.

20. The method of claim 19 further comprises selecting another one of the plurality of calculated output frequencies from the one set when the output frequency is to be adjusted.

21. The method of claim 20 further comprises adjusting a first divider value and a second divider value of the at least one divider ratio contemporaneously using a change enable signal.

* * * * *